(12) United States Patent
Batcher

(10) Patent No.: US 6,763,475 B1
(45) Date of Patent: Jul. 13, 2004

(54) SYSTEM FOR CONTROLLING THE EFFECTS OF GLITCHING USING LEVEL SENSITIVE LATCHES

(75) Inventor: Kenneth W. Batcher, Hudson, OH (US)

(73) Assignee: Cisco Technology, Inc., San Jose, CA (US)

(*) Notice: Subject to any disclaimer, the term of this patent is extended or adjusted under 35 U.S.C. 154(b) by 616 days.

(21) Appl. No.: 09/676,369

(22) Filed: Sep. 29, 2000

(51) Int. Cl.[7] ............................ G06F 13/42; G06F 7/00
(52) U.S. Cl. ...................... 713/400; 713/401; 713/500; 713/600; 714/709
(58) Field of Search ................................ 713/400, 401, 713/500, 600; 714/709; 327/141, 144, 153; 326/93, 94

(56) References Cited

U.S. PATENT DOCUMENTS

| | | | | |
|---|---|---|---|---|
| 4,797,575 A | * | 1/1989 | Lofgren | 327/202 |
| 5,113,098 A | | 5/1992 | Teymouri | 307/520 |
| 5,185,537 A | | 2/1993 | Creedon et al. | 307/234 |
| 5,231,636 A | | 7/1993 | Rasmussen | 370/100.1 |
| 5,315,181 A | | 5/1994 | Schowe | 307/480 |
| 5,387,825 A | | 2/1995 | Cantrell et al. | 326/26 |
| 5,774,005 A | * | 6/1998 | Partovi et al. | 327/210 |
| 5,949,258 A | * | 9/1999 | Jeong | 327/97 |
| 6,016,066 A | | 1/2000 | Ilkbahar | 327/23 |
| 6,055,587 A | | 4/2000 | Asami et al. | 710/49 |
| 6,075,392 A | | 6/2000 | Sandner | 327/145 |

FOREIGN PATENT DOCUMENTS

JP  01226212 A  *  9/1989  ............ H03K/5/00

OTHER PUBLICATIONS

Cappello, P.; LaPaugh, A.; Steiglitz, K.; "Optimal choice of intermediate latching to maximize throughput in VLSI circuits", Acoustics, Speech, and Signal Processing [also IEEE Trans. on Sig. Proc], IEEE Trans. on, vol. 32, Iss. 1, Page(s): 28–33.*

* cited by examiner

Primary Examiner—Thomas Lee
Assistant Examiner—James K. Trujillo
(74) Attorney, Agent, or Firm—Tucker Ellis & West LLP

(57) ABSTRACT

A system for controlling the effects of "glitching" on a high speed digital bus using one or more level sensitive latches. Reductions in the propagation of intermediate transitioning data results in reduced power consumption by the digital circuit, which is particularly important in wireless communication applications.

49 Claims, 6 Drawing Sheets

SYSTEM FOR CONTROLLING THE EFFECTS OF GLITCHING USING LEVEL SENSITIVE LATCHES

FIELD OF INVENTION

The present invention generally relates to glitching (i.e., intermediate logic transitions in a logic circuit resulting from changes in logical states), and more specifically to a system for controlling the effects of glitching using level sensitive latches.

BACKGROUND OF THE INVENTION

Large buses are common internal structures in integrated circuit designs. These buses are needed to carry groups of common signals for data and control. For example, an instruction bus delivers the instruction to be executed to the instruction decoder inside a processor ASIC. During normal operation, these multiplexed or tri-state bus structures are prone to decode "glitching," which results from rapid intermediate logic state transitions from '1' to '0' or vice versa, before settling to a final logic state. These migratory or transient logic states occur due to combinatorial decoding and are unavoidable due to transport delays and differential timing of the logic inputs.

Functionally, with synchronous designs, glitches are harmless since intermediate states occur just after the active clock edge and settle out to a stable value before the end of the clock cycle. However, the wasted power consumption caused by these fruitless transitions are a concern in power sensitive applications. The problem becomes magnified on large buses since the capacitive load is great and the fanout cone can be large, thereby propagating the glitching transitional data all over the chip. With faster and faster speed designs now approaching nano-meter dimensions, it is also desirable to reduce the noise caused by buses to prevent adverse electrical effects such as crosstalk.

Many prior art approaches exist for solving problems of this nature. Most involve manipulating the combinatorial decodes to prevent the transmission of glitching transitional data. For example, decodes can be gated to an "off-state," wherein contents settle. This gating is carefully constructed to avoid the transmission of glitching transitional data. However, this approach can be difficult to implement due to the wide variance of timing that occurs when a design is placed, routed and fabricated into a device. Moreover, such designs may add to the critical path timing of certain paths.

Registering of bus signals before driving the bus load is also a common technique, but is not always possible in all designs due to the extra functional clock cycle delay imposed by the logic change. Gating of register clocks is another approach which can reduce flip flop transitions and hence the chance of glitching. However, the gating of register clocks causes testing issues and timing problems which effect a wide variety of registers.

In tri-state bus implementations, the glitching problem has been addressed by manipulating the tri-state enable logic. In this regard, when a tri-state buffer is enabled (i.e., turned on to drive), the enable signal is carefully controlled to turn on only after the data input to the buffer has settled. However, tri-state logic creates numerous problem with testing and bus contention especially in ASIC designs. Consequently, multiplexed buses are typically chosen.

The present invention provides an easy to implement and effective means for minimizing or eliminating the transmission of "transitioning" data resulting from changes in the logic state of combinatorial logic, and for improving hold times.

SUMMARY OF THE INVENTION

According to the present invention there is provided a method for controlling the effects of glitching transitions on internal buses, using a latch to prevent the propagation of the glitching transitions.

According to another aspect of the present invention there is provided a system for controlling data flow between a first digital circuit and a second digital circuit, comprising: at least one latch for receiving and storing data from the first digital circuit, and outputting the stored data to the second digital circuit; and at least one latch enable circuit for controlling the opening and closing of the at least one latch, wherein said at least one latch receives and stores data from the first digital circuit when open, and retains the stored data when closed, wherein said latch enable circuit closes the at least one latch in response to a transition of a first clock signal and opens the at least one latch in response to a transition of a second clock signal, wherein the second clock signal is delayed relative to the first clock signal.

According to another aspect of the present invention there is provided a system for controlling data flow between a first digital circuit and a second digital circuit, comprising: at least one means for latching data received from the first digital circuit, and outputting the latched data to the second digital circuit; and at least one means for latch enablement for controlling the opening and closing of the at least one means for latching data, wherein said at least one means for latching data receives data from the first digital circuit when open, and retains the latched data when closed, wherein said means for latch enablement closes the at least one means for latching data in response to a transition of a first clock signal and opens the at least one means for latching data in response to a transition of a second clock signal, wherein the second clock signal is delayed relative to the first clock signal.

According to another aspect of the present invention there is provided a method for controlling transfer of data between a first digital circuit and a second digital circuit via a latch arranged therebetween to transfer data stored in the latch from the first digital circuit to the second digital circuit, wherein opening and closing of the latch is controlled by a latch enable circuit, the method comprising the steps of: closing the latch in response to a transition of a first clock signal; and opening the latch to receive and store data from the first digital circuit in response to a transition of a second clock signal, wherein the second clock signal is delayed relative to the first clock signal.

An advantage of the present invention is the provision of system for controlling the effects of glitching transitions to reduce power reduction.

Another advantage of the present invention is the provision of a system for controlling the effects of glitching transitions, which extends a hold time, thereby preventing race conditions on a bus.

Another advantage of the present invention is the provision of system for controlling the effects of glitching transitions which has low hardware costs for implementation.

Still another advantage of the present invention is the provision of a system for controlling the effects of glitching transitions that it is easily scalable to accommodate large buses.

Still another advantage of the present invention is the provision of a system for controlling the effects of glitching transitions that is applicable to a variety of different digital circuit arrangements.

Yet another advantage of the present invention is the provision of a system for controlling the effects of glitching transitions that is simple to implement and easy to use.

Still other advantages of the invention will become apparent to those skilled in the art upon a reading and understanding of the following detailed description, accompanying drawings and appended claims.

BRIEF DESCRIPTION OF THE DRAWINGS

The invention may take physical form in certain parts and arrangements of parts, a preferred embodiment and method of which will be described in detail in this specification and illustrated in the accompanying drawings which form a part hereof, and wherein.

DETAILED DESCRIPTION OF THE PREFERRED EMBODIMENT

It should be appreciated that while a preferred embodiment of the present invention is described in connection with digital circuits having a multiplexer, a tri-state buffer and a bus, the present invention is contemplated for use in connection with digital circuits having other digital components, wherein transitioning of a digital value may result in the unnecessary consumption of power, or may impair or disrupt operation of a digital circuit.

Figure 1:
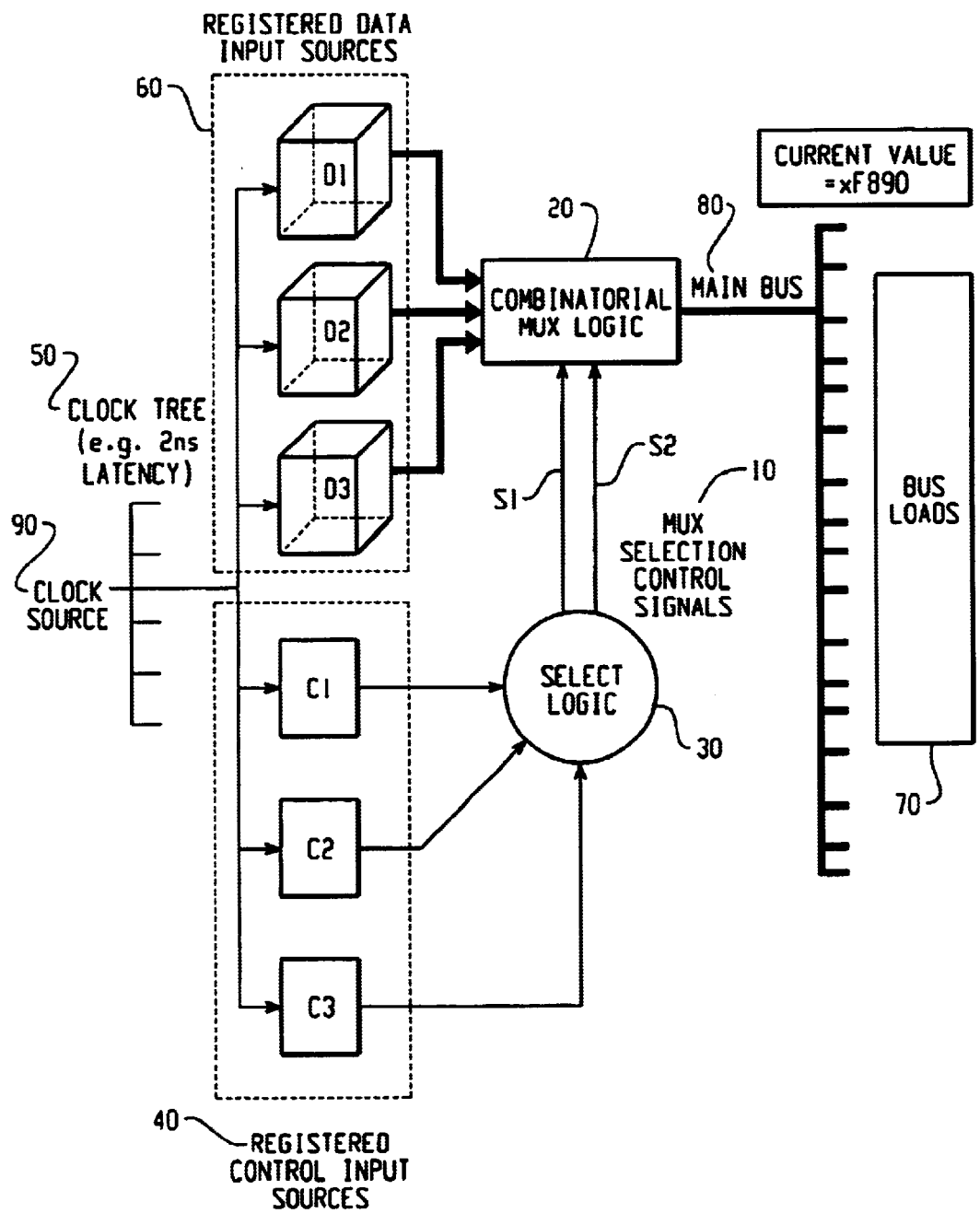
FIG. 1 is a block diagram of a hardware configuration for putting data on a bus, according to the prior art.

Referring now to the drawings wherein the showings are for the purpose of illustrating a preferred embodiment of the invention only and not for purposes of limiting same, FIG. 1 shows a typical hardware configuration for putting data on a bus, as used in most systems employing multiplexed bus structures. The multiplexing is done with combinatorial multiplexer (mux) logic 20, which provides decoding logic to select one output among various registered data input sources 60 (D1–D3). In the illustrated embodiment, each data input source D1–D3 is a 16-bit register. Select logic 30 decodes various registered control input sources 40 (C1–C3), and transmits appropriate multiplexer (mux) selection control signals 10 (S1 and S2) to combinatorial mux logic 20. In the illustrated embodiment, each control input source C1–C3 is a 1-bit register, and S1 and S2 are each one bit values.

Mux selection control signals 10 (S1 and S2) select the desired registered data input source 60 to drive onto a main bus 80. In the illustrated embodiment, bus 80 is a 16-bit bus, and fans out to many destinations (i.e., to bus loads 70) including memories, other registers, as well as other digital devices. With most synchronous design methodologies, registered data input sources 60 and registered control input sources 40 are clocked with the same clock edge.

Since there may be numerous (e.g., thousands) of devices clocked off the same clock source 90, typically the fanout of the clock source is designed with a balanced set of buffers (i.e., plurality of levels of buffers), commonly referred to as a "clock tree" (i.e., the clock tree 50). This balances the skew of clocked devices to avoid clocking problems between output to input paths of the various clocked devices. Clock tree 50 adds clock latency (i.e., time from clock source 90 to the clock destinations) with each level of buffers in clock tree 50. This clock latency is of little consequence in most operations, since the synchronous transfer from clocked device to clocked device occur with a balanced clock skew (i.e., all clocked devices see about the same latency) so that data capture problems are prevented.

As indicated above, the prior art causes wasteful power consumption. In this regard, there are a plurality of different timing paths from registered data input sources 60 to the output of bus 80. Similarly, there are a plurality of different timing paths from registered control input sources 40 (through the select logic 30 and through the combinatorial mux logic 20), which affect the output of bus 80. Therefore, just after a clock transition, bus 80 will begin to change state as these different timing paths become excited. These transitions are often referred to as "settling times," since the timing paths migrate or transition to intermediate states before resolving to a final state.

Figure 3A:
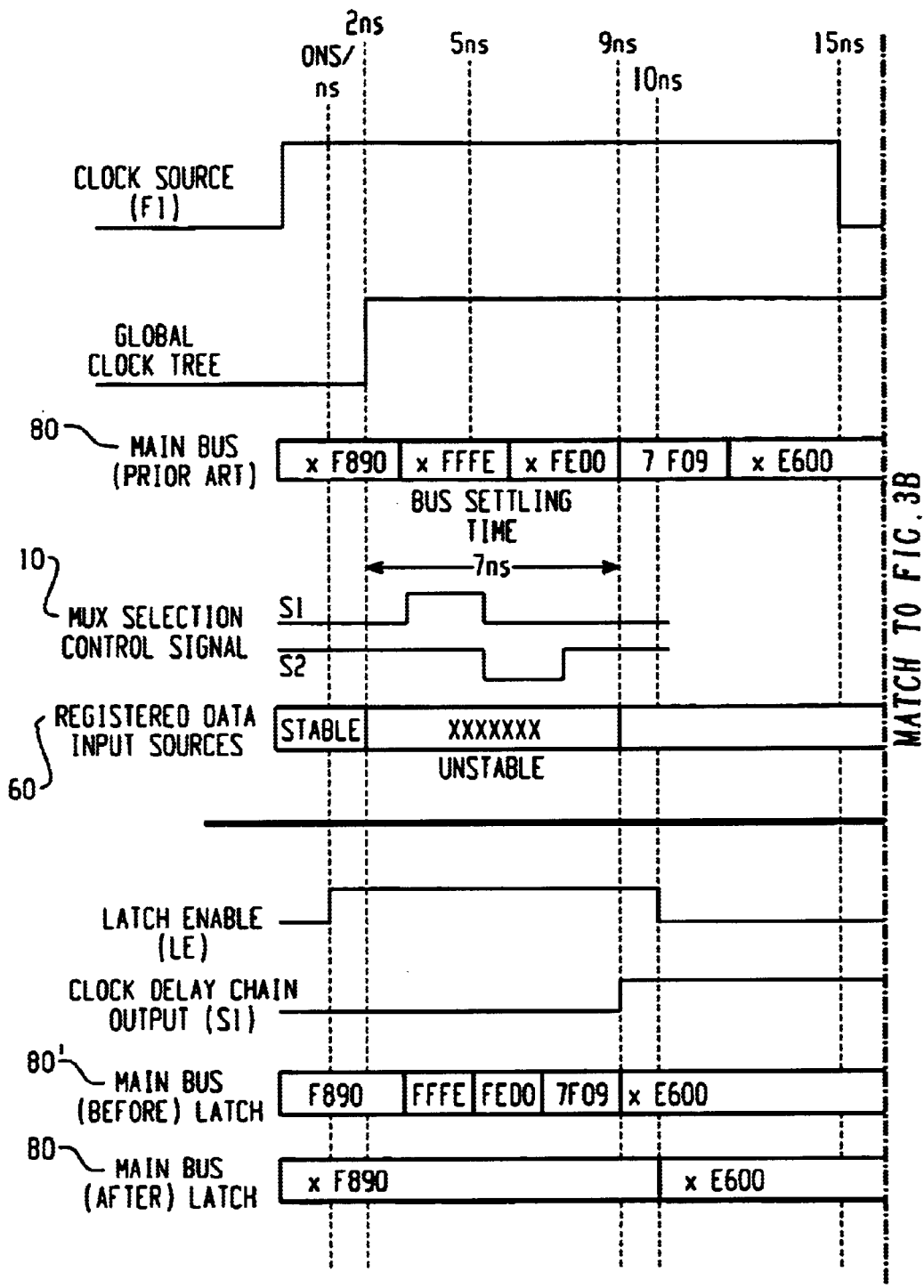
FIG. 3 is a timing diagram illustrating the timing of systems according to the prior art and the present invention.
Figure 3B:
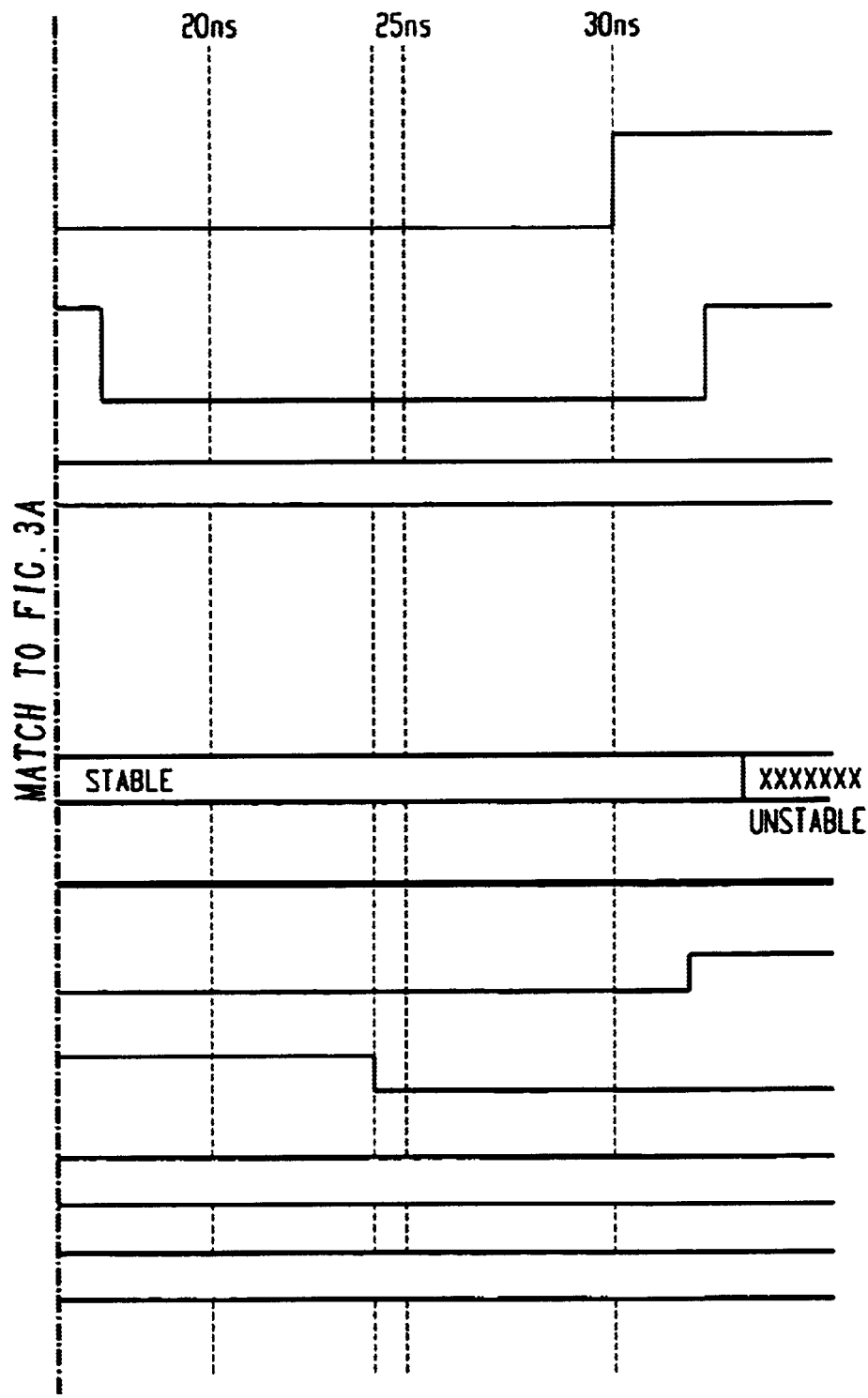

Referring now to FIG. 3, there is shown a timing diagram showing resulting signals for the prior art, as well as in accordance with a preferred embodiment of the present invention. Assume at time 2 ns, when the clock edge (i.e., 30 ns cycle time) propagates through the global clock tree 50, the output of main bus 80 (prior art) is currently xF890 (16-bit hexadecimal number), and a synchronous transition occurs to logic state xE600 at the next clock edge (at time 32 ns). Accordingly, there will be a total of 6 bit changes in the logic state on main bus 80, according to the prior art. (e.g., bits 12, 11, 7 and 4 will go low, bits 10 and 9 will go high, while the remaining bits will remain unchanged). However, at time 3 ns the mux selection control signals 10 and newly updated registered data input sources 60 experience differential propagation delays when arriving at combinatorial mux logic 20 shown in FIG. 1. In this regard, a partially decoded result is experienced from the select logic 30 which results in the selection of a different registered data input source (xFFFE) at combinatorial mux logic 20. At time t=5 ns, yet a different registered data input source (xFED0) is selected as the mux selection decode signals 10 keep settling. Finally, at time t=7 ns, the final correct register data input source is selected by select logic 30. However, the new value at the final correct register data input source (which was updated at clock edge at time 2 ns) has not arrived at combinatorial multiplexing logic 20, due to long propagation delays between the register data input source 60 and the multiplexing logic 20. Therefore, the old value stored at the final correct register data input source is driven onto main bus 80 (prior art) by combinatorial mux logic 20 causing more logic transitions. Finally, at time t=9 ns the new value has propagated through the combinatorial mux logic 20, and has been driven onto main bus 80 (prior art). However, during the 7 ns (i.e., from t=2 ns to t=9 ns) of settling time, many transitions have been seen on main bus 80 (prior art), which in turn, have been propagated to many different destinations via main bus 80 (prior art). As a result, there is a significant waste of power, as will be explained below. This example illustrates just one of many possible different timing scenarios which may exist in a logic design.

With CMOS logic, the bulk of power consumption occurs when logic changes state. This is magnified by the amount of capacitance or charge contained on the bus wires. The simplified formula for dynamic CMOS power consumption is as follows:

$$\text{power consumption} = (\text{amount of transitions}) \times (\text{capacitance}) \times (\text{voltage})^2$$

Therefore, a transitioning bus with a capacitance of 10 pF consumes ten times as much power as a transitioning bus with a capacitance of 1 pF. This also applies if the bus is buffered by multiple buffer stages (i.e., fanout split up by different logic buffers), since the entire capacitive buffer network will transition. Thus, for high fanout heavy load buses, a significant amount of power will be wasted during the bus settling time.

Figure 2:
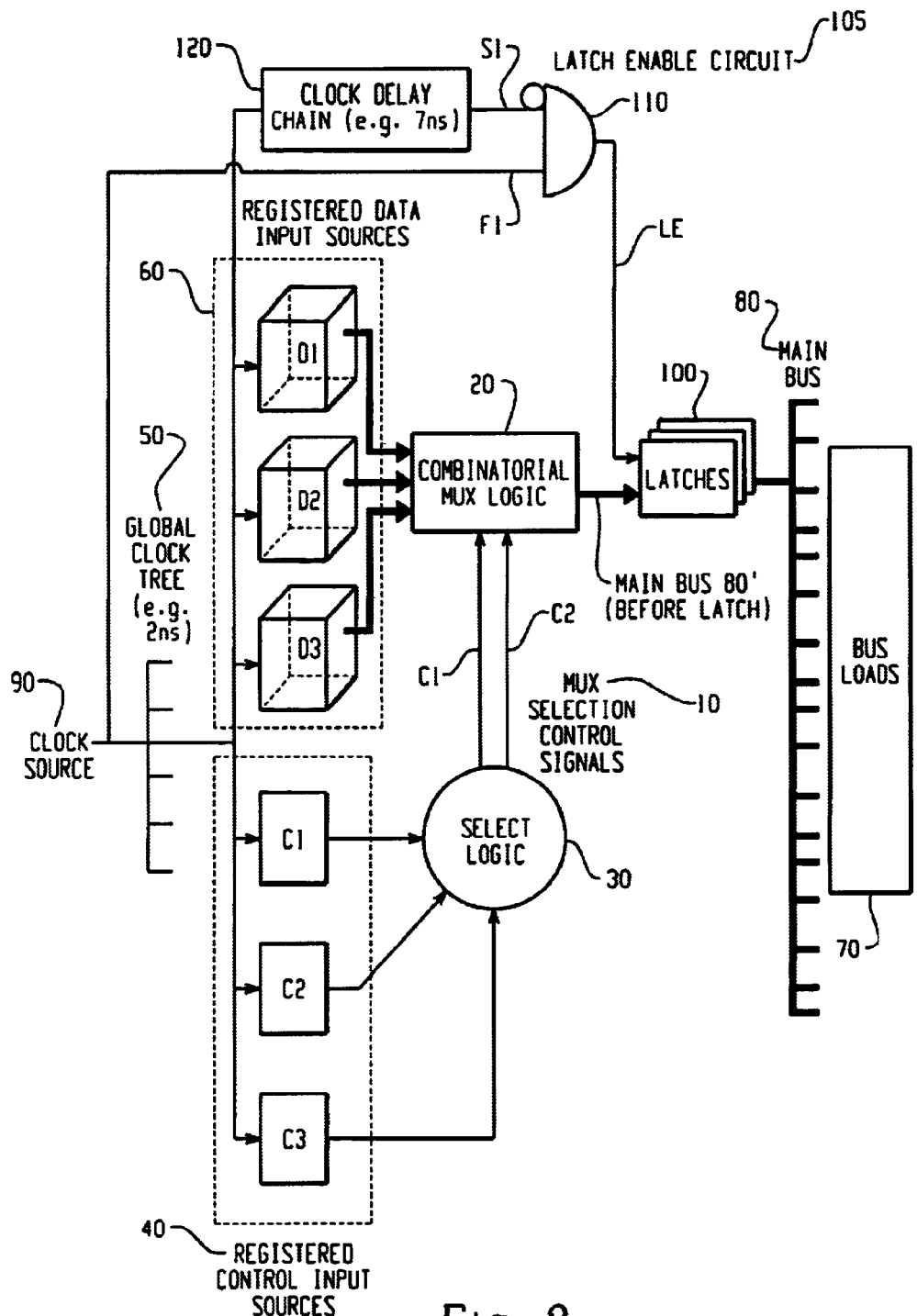
FIG. 2 is a block diagram of a hardware configuration for putting data on a bus, according to a preferred embodiment of the present invention.

Referring now to FIG. 2, a preferred embodiment of the present invention will be described. The present invention uses quieting level sensitive latches 100 on the output of combinatorial mux logic 20 to reduce or eliminate the settling time effects experienced when driving the entire bus load. A single latch 100 is provided for each bit of main bus 80. For instance, 16 latches 100 are respectively used for a 16-bit bus. In accordance with a first embodiment of the present invention, latch enable circuit 105 controls bus quieting latches 100 as follows (FIG. 3):

(1) latches 100 close in response to a rising clock edge created from a fast clock signal F1 derived directly from main clock source 90, which is taken before the clock tree 50. It will be understood that due to propagation delays through the latch enable circuit 105, latches 100 will close during the period of time after the rising clock edge of fast clock signal F1, but before or concurrent with the rising clock edge of the global clock tree (e.g., at t=1 ns); and (2) latches 100 open in response to a rising clock edge derived from a delayed (inverted) clock signal S1, taken after the global clock tree 50, and clock delay chain 120 providing a delay according to elapse of a bus "worst case" settling time. As indicated above, due to propagation delays through latch enable circuit 105, latches 100 will open during the period of time just after the clock edge of clock signal S1 has risen (e.g., 1–2 ns after the rising clock edge).

In accordance with a preferred embodiment of the present invention, latch enable circuit 105 for enforcing the above clocking arrangement includes a single two input "AND" logic gate 110, which has a fast clock signal F1 (from before global clock tree 50) and an inverted and slowed clock signal S1 (delayed by the maximum bus settling time, as provided by clock delay chain 120). Clock delay chain 120 is comprised of a plurality of cascaded buffers for providing an active output signal S1 that is delayed by the maximum bus settling time. It should be appreciated that clock delay chain 120 may provide an active output signal S1 that is delayed by a value greater or lesser than the maximum bus settling, or with a different timing function.

Slowed clock signal S1 enforces the slowed clock input, giving a deterministic delay. When the latch enable signal LE is high, latch 100 is closed (i.e., frozen), and no new data is received. When latch enable signal LE is low, latch 100 is open, and thus propagates data from input to output. The waveforms of output signals signals S1 and LE (i.e., output of logic gate 110), are illustrated in the lower portion of FIG. 3.

It should be understood that registered data input sources 60, registered control input sources 40, select logic 30 and mux logic 20 comprise a first digital circuit, while main bus 80 and bus loads 70 comprise a second digital circuit. The present invention, comprised of latch enable circuit 105 and latches 100 act as a gate for passing data between the first and second digital circuits. The timing associated with the opening and closing of latches 100 determines what data provided by the first digital circuit is passed to the second digital circuit. It should be appreciated that the elements of the first and second digital circuits may take many forms, as discussed herein.

Using the above timing example with a preferred embodiment of the present invention (with particular reference to the lower portion of FIG. 3), the bus settling time from t=2 ns to t=9 ns still occurs. However, latches 100 will be closed at time t=2 ns, and will not be reopened until time t=10 ns. Therefore, bus loads 70 see the "stable" old value xF890 on bus 80 (after latch) until latch 100 opens. At time t=10 ns, latches 100 reopen and bus load 70 sees only six transitions on bus 80 to the new value xE600. The main bus at the input of latches 100 (i.e., main bus 80', before latch) still sees all the glitching transitions as previous described from time t=2 ns to t=7 ns. However, the capacitance on the main bus 80' at the input of latches 100, is far lower than that seen on the main bus 80 at the output of latches 100 (since the latch output drives entire bus load 70). Consequently, less power is consumed.

Critical paths must be carefully evaluated using the preferred embodiment in order to make it effective. The close time of latches 100 should be tuned to avoid setup/hold time complications. Ideally, latches 100 will close at the same time as the other clocked sources see the clock pulse after the clock tree latency. In this way, except for a slight amount of skew between the global clock tree 50 and the latch enable signal (LE), the system is fully synchronous at the same clock edge. For example, if latches 100 close later than expected (e.g., at t=4 ns instead of t=2 ns), there could be a race condition issue and the latches 100 could capture the wrong data. Adding latches 100 to the circuit may also add slightly to the critical paths which go through main bus 80 to the destinations of bus loads 70. However, if tuned carefully, latches 100 will add little or nothing to the critical path.

Furthermore, clock balancing for the delays on signals F1 and S1 do not have to be exact. In this regard, assume that the propagation delays are less than expected, and thus cause latches 100 to close early at time t=1 ns and open early at time t=7 ns, rather than closing at time t=2 ns and opening at time t=9 ns. Bus loads 70 would see 2 ns (from t=7 ns to t=9 ns) of settling time. This is superior to the 7 ns of settling time previously experienced. The closing time of t=1 ns is not ideal and does make the setup time to latch 100 worse by 1 ns, which is not an issue unless the delays for timing paths through main bus 80 are very long. Therefore, an estimation of settling time in the clock delay chain 120 can be used to eliminate some or all bus settling time transitions seen on the main bus.

Figure 4A:
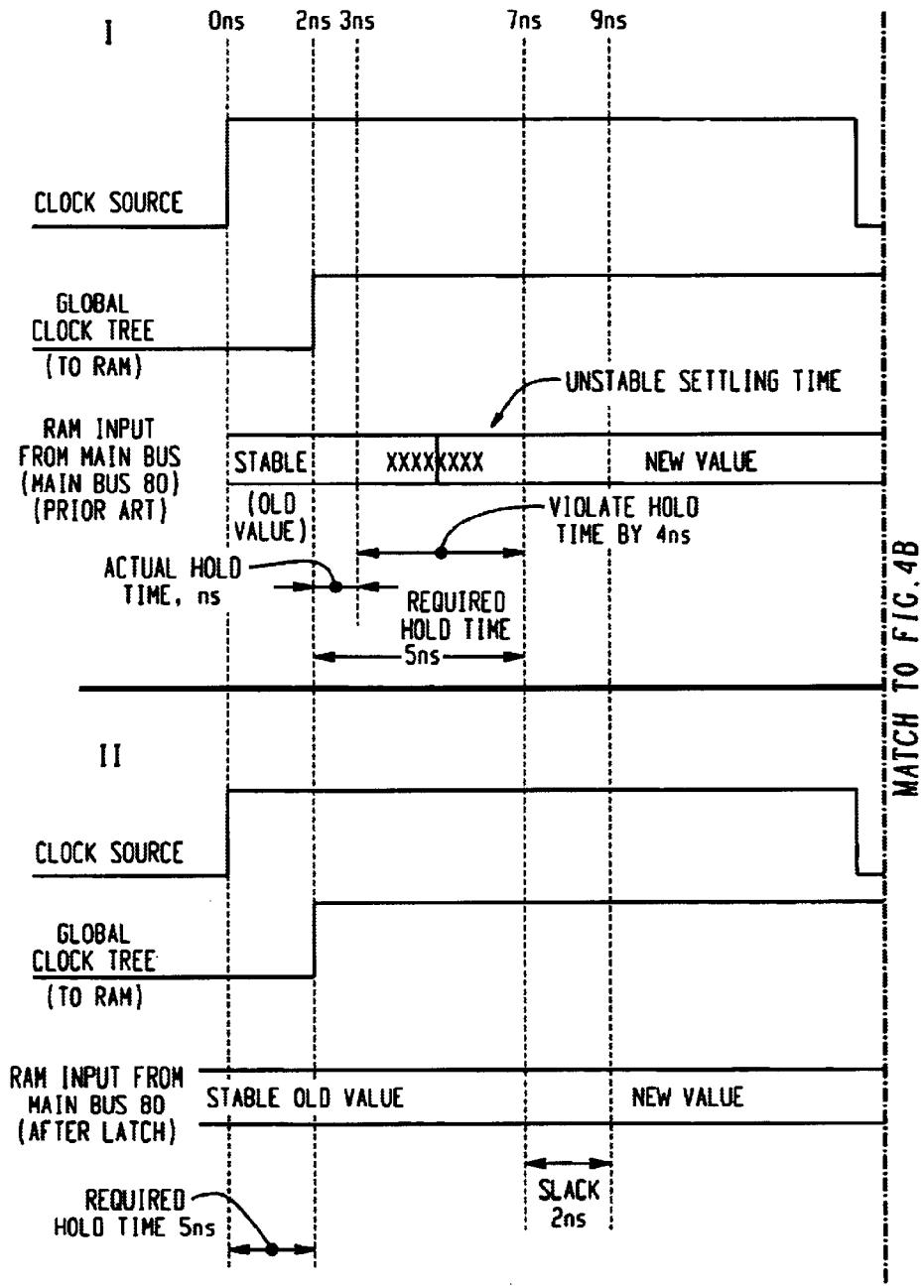
FIG. 4 is a timing diagram illustrating improvement in the hold time, according to a preferred embodiment of the present invention.
Figure 4B:
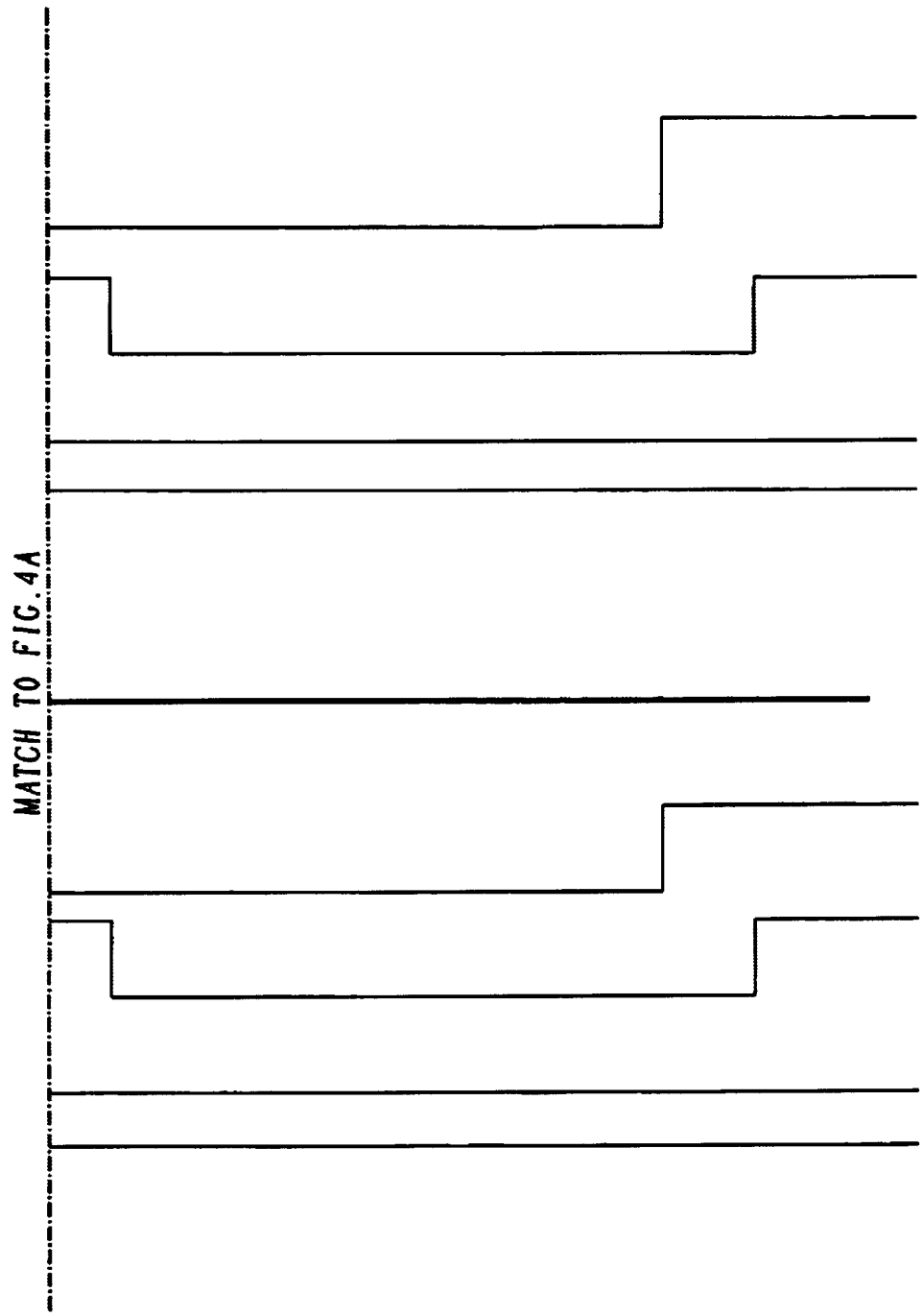

One further benefit of the preferred embodiment of the present invention is the improvement provided with bus hold times, as will now be described with reference to FIG. 4. Assume one of the bus loads 70 is a synchronous RAM device connected to the bus via data input port of the RAM, and clocked off global clock tree 50. This requires 5 ns of data hold time after the clock edge to ensure that a write occurs correctly. For example, a fast timing path from a registered control input source 40 may cause a race condition to occur through the combinatorial mux logic 20 that causes a settling time to start at time t=3 ns, or 1 ns after the clock edge of the global clock tree. Using the prior art, the data hold time is violated at the RAM input by 4 ns, as shown in FIG. 4. However, the present invention does not propagate this racing change at the RAM input, since latch 100 closes at time t=2 ns, and holds the correct value steady for the RAM until t=9 ns.

It should be understood that the present invention is also suitably applicable to memory devices, including, but not limited to RAMs, register files, or ROMs. In this alternative embodiment, mux logic 20 (FIG. 2), is replaced with a memory device. Select logic 30 is used to present address, R/W, and chip select (CS) signals (i.e., control signals) to the memory device. When a read cycle occurs, the memory access time must elapse before valid data is obtained from the memory output. Thus, during the time from start of clock cycle, to the address/CS/RW signals valid at the memory input, and then from valid data out of the memory; the memory output will be settling. During this time, the memory output can be quieted using the same latching mechanism, wherein the memory settling time estimation is used in delay chain 120, instead of the bus settling time. This also applies to R/W memories employing a write-through cycle, wherein during writes the memory output transitions.

In yet another alternative embodiment, tri-state buses are used in connection with the present invention. These buses are driven by a plurality of tri-state buffers which have a data input, data output, and enable input. When the enable input is asserted, the tri-state buffer is ON, and propagates data from input to output. When the enable input is OFF, the tri-state buffer does not drive and the output floats, thus allowing other devices to drive the bus. In this alternative embodiment, the quieting latches 100 feed the data input to the tri-state buffer, and the tri-state buffer then drives main bus 80. Therefore, the tri-state buffer is placed between quieting latches 100 and main bus 80. Quieting latches 100 can also be suitably used at the enable input of the tri-state buffer to prevent the transmission of glitching transitions. Settling time is estimated by measuring the delay from clock edge to valid data, at the enable and data inputs of the tri-state buffer. In this manner, the tri-state buffer will not present glitching data onto main bus 80 or glitch the tri-state enable, possibly causing bus contention.

It should be appreciated that the present invention can be applied to embedded logic (ASIC) or discrete logic elements on printed circuit boards (PCBs). Anywhere that buses driven by CMOS logic exists are possible candidates for the present invention. Typically, latches are only needed on a few key buses in a logic device which have a high fanout load. Therefore, adding a few quieting latches and latch enable logic will result in a sizeable power savings at a low cost.

In accordance with an alternative embodiment of the present invention, a different latch enable circuit 105 and latch 100 is provided for each bit of the main bus. In this regard, differential timing delays experienced in some designs may cause some bits to have a longer settling time than others. Therefore, delay chain values of varying duration are used in connection with the respective latches.

In yet another alternative embodiment, quieting latches are provided selectively to only certain bits of the main bus. For instance, quieting latches may be provided to those bits especially subject to glitching, while no quieting latches are provided to the remaining bits (since they do not suffer from glitch effects). Furthermore, quieting latches may not be added to certain bits due to their time critical nature. For example, assume some time critical path exists which takes 49 ns of a 50 ns cycle time to bit 13 of some bus load destination. It may be decided to let the bit "glitch," rather than risk adding the quieting latch, which may add 1 ns to the timing path, resulting in a missed setup time to that destination. However, the non-time critical bits may have quieting latches.

It should be further appreciated that in yet another alternative embodiment of the present invention, one or more of the latches 100 may remain closed for an entire clock cycle (e.g., when a main bus does not need to be updated, such as in the case of a processor stall cycle). In this embodiment, 2-input AND gate 110 is replaced with a 3-input AND gate, wherein the third input is a "master" enable control signal. Master enable control signal keeps the respective latches 100 disabled (i.e., closed) at times when the bus is not "active."

The current invention is simple to implement and scalable, requiring only one quieting latch for each bit of the main bus. At least one latch enable and delay chain block is required for each set of latches. Timing effects of the latch enable and propagation delay can be controlled in design, and analyzed fully using static timing analysis tools commercially available. Analysis is simplified since there is typically one point of timing (the latch enable logic) which needs to be characterized.

The present invention has been described with reference to preferred embodiments. Obviously, modifications and alterations will occur to others upon a reading and understanding of this specification. It is intended that all such modifications and alterations be included insofar as they come within the scope of the appended claims or the equivalents thereof.

Having thus described the invention, it is now claimed:

1. A system for controlling data flow between a first digital circuit and a second digital circuit, comprising:
   at least one level-sensitive latch for receiving data from the first digital circuit, and propagating the received data to the second digital circuit; and
   at least one latch enable circuit for controlling the opening and closing of the at least one level-sensitive latch, wherein said at least one level-sensitive latch propagates the data from the first digital circuit when open, and blocks the data when closed,
   wherein said latch enable circuit closes the at least one level-sensitive latch in response to a transition of a first clock signal and opens the at least one level-sensitive latch in response to a transition of a second clock signal, wherein the second clock signal is delayed relative to the first clock signal.

2. A system according to claim 1, wherein said latch enable circuit includes a clock delay chain for generating the second clock signal, said clock delay chain adding a predetermined delay to a third clock signal to generate the second clock signal, wherein said third clock signal is derived from said first clock signal.

3. A system according to claim 2, wherein said third clock signal is generated by a global clock tree and is delayed relative to the first clock signal.

4. A system according to claim 2, wherein said predetermined delay is associated with a settling time.

5. A system according to claim 4, wherein said predetermined delay is equal to the settling time.

6. A system according to claim 4, wherein said predetermined delay is greater than the settling time.

7. A system according to claim 4, wherein said predetermined delay is less than the settling time.

8. A system according to claim 1, wherein said first digital circuit includes multiplexer logic receiving data from a plurality of data input sources and selection control signals for selecting one of said plurality of data input sources, said multiplexer logic outputting data to the at least one level-sensitive latch.

9. A system according to claim 1, wherein said second digital circuit includes a bus.

10. A system according to claim 1, wherein said second digital circuit includes a tri-state buffer receiving data from the at least one level-sensitive latch, wherein the tri-state buffer outputs data to a tri-state bus.

11. A system according to claim 1, wherein said second digital circuit includes a tri-state buffer receiving data from the at least one level-sensitive latch for enabling the input of the tri-state buffer, said tri-state buffer outputting data to a tri-state bus.

12. A system according to claim 1, wherein said first digital circuit includes a memory device, said memory device receiving control data for reading or writing data from/to the memory device, wherein said memory device outputs data to the at least one level-sensitive latch.

13. A system according to claim 1, wherein one level-sensitive latch is provided for each respective bit of the data output from the first digital circuit.

14. A system according to claim 1, wherein a level-sensitive latch is provided for less than each respective bit of the data output from the first digital circuit.

15. A system according to claim 1, wherein one latch enable circuit is respectively provided for each said level-sensitive latch.

16. A system according to claim 1, wherein one latch enable circuit is provided for all of said level-sensitive latches.

17. A system according to claim 1, wherein one latch enable circuit is respectively provided for fewer than all of said level-sensitive latches.

18. A system according to claim 1, wherein said level-sensitive latch remains closed for more than one cycle of the second clock signal.

19. A system for controlling data flow between a first digital circuit and a second digital circuit, comprising:
at least one means for level-sensitively latching data received from the first digital circuit, and outputting the latched data to the second digital circuit; and
at least one means for latch enablement for controlling the opening and closing of the at least one means for level-sensitively latching data, wherein said at least one means for level-sensitively latching data propagates data from the first digital circuit when open, and blocks the latched data when closed,
wherein said means for latch enablement closes the at least one means for level-sensitively latching data in response to a transition of a first clock signal and opens the at least one means for level-sensitively latching data in response to a transition of a second clock signal, wherein the second clock signal is delayed relative to the first clock signal.

20. A system according to claim 19, wherein said means for latch enablement includes a means for clock delay, for generating the second clock signal, said means for clock delay adding a predetermined delay to a third clock signal to generate the second clock signal, wherein said third clock signal is derived from said first clock signal.

21. A system according to claim 20, wherein said third clock signal is generated by a global clock tree and is delayed relative to the first clock signal.

22. A system according to claim 20, wherein said predetermined delay is associated with a settling time.

23. A system according to claim 22, wherein said predetermined delay is equal to the settling time.

24. A system according to claim 22, wherein said predetermined delay is greater than the settling time.

25. A system according to claim 22, wherein said predetermined delay is less than the settling time.

26. A system according to claim 19, wherein said first digital circuit includes means for multiplexing data received from a plurality of data input sources, wherein said means for multiplexing data receiving selection control signals for selecting one of said plurality of data input sources, said means for multiplexing data outputting data to the at least one means for level-sensitively latching data.

27. A system according to claim 19, wherein said second digital circuit includes means for transmitting data.

28. A system according to claim 19, wherein said second digital circuit includes a means for buffering data received from the means for level-sensitively latching, wherein the means for buffering outputs data to a means for transmitting data.

29. A system according to claim 19, wherein said second digital circuit includes a means for buffering data, said means for buffering data having an input enable receiving data from the means for latching data to enable the input of data to the means for buffering data.

30. A system according to claim 19, wherein said first digital circuit includes a means for storing data, said means for storing data receiving control data for reading or writing data from/to the means for storing data, wherein said means for storing data outputs data to the at least one means for level-sensitively latching data.

31. A system according to claim 19, wherein one means for level-sensitively latching data is provided for each respective bit of the data output from the first digital circuit.

32. A system according to claim 19, wherein a means for level-sensitively latching data is provided for less than each respective bit of the data output from the first digital circuit.

33. A system according to claim 19, wherein one means for latch enablement is respectively provided for each said means for level-sensitively latching data.

34. A system according to claim 19, wherein one means for latch enablement is provided for all of said means for level-sensitively latching data.

35. A system according to claim 19, wherein one means for latch enablement is respectively provided for fewer than all of said means for level-sensitively latching data.

36. A system according to claim 19, wherein said means for level-sensitively latching data remains closed for more than one cycle of the second clock signal.

37. A method for controlling transfer of data between a first digital circuit and a second digital circuit via a level-sensitive latch arranged therebetween to transfer data through the level-sensitive latch from the first digital circuit to the second digital circuit, wherein opening and closing of the level-sensitive latch is controlled by a latch enable circuit, the method comprising the steps of:
closing the level-sensitive latch to block the data in response to a transition of a first clock signal; and
opening the level-sensitive latch to propagate the data from the first digital circuit in response to a transition of a second clock signal, wherein the second clock signal is delayed relative to the first clock signal.

38. A method according to claim 37, wherein said latch enable circuit includes a clock delay chain for generating the second clock signal, said clock delay chain adding a predetermined delay to a third clock signal to generate the second clock signal, wherein said third clock signal is derived from said first clock signal.

39. A method according to claim 38, wherein said third clock signal is generated by a global clock tree and is delayed relative to the first clock signal.

40. A method according to claim 38, wherein said predetermined delay is associated with a settling time.

41. A method according to claim 40, wherein said predetermined delay is equal to the settling time.

42. A method according to claim 40, wherein said predetermined delay is greater than the settling time.

43. A method according to claim 40, wherein said predetermined delay is less than the settling time.

44. A method according to claim 37, wherein one level-sensitive latch is provided for each respective bit of the data output from the first digital circuit.

45. A method according to claim 37, wherein a level-sensitive latch is provided for less than each respective bit of the data output from the first digital circuit.

46. A method according to claim 37, wherein one latch enable circuit is respectively provided for each said level-sensitive latch.

47. A method according to claim 37, wherein one latch enable circuit is provided for all of said level-sensitive latches.

48. A method according to claim 37, wherein one latch enable circuit is respectively provided for fewer than all of said level-sensitive latches.

49. A method according to claim 37, wherein said level-sensitive latch remains closed for more than one cycle of the second clock signal.

* * * * *